United States Patent
Dong

(10) Patent No.: US 11,545,517 B2
(45) Date of Patent: Jan. 3, 2023

(54) CHIP PACKAGE STRUCTURE, ELECTRONIC DEVICE AND METHOD FOR PREPARING A CHIP PACKAGE STRUCTURE

(71) Applicant: SHENZHEN GOODIX TECHNOLOGY CO., LTD., Shenzhen (CN)

(72) Inventor: Haoxiang Dong, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 37 days.

(21) Appl. No.: 16/830,266

(22) Filed: Mar. 26, 2020

(65) Prior Publication Data

US 2020/0395402 A1   Dec. 17, 2020

Related U.S. Application Data

(63) Continuation-in-part of application No. PCT/CN2019/091235, filed on Jun. 14, 2019.

(51) Int. Cl.
*H01L 27/14* (2006.01)
*H01L 27/146* (2006.01)
(Continued)

(52) U.S. Cl.
CPC .... *H01L 27/14678* (2013.01); *G06V 40/1318* (2022.01); *H01L 24/32* (2013.01);
(Continued)

(58) Field of Classification Search
CPC ... H01L 27/14678; H01L 24/32; H01L 24/48; H01L 24/73; H01L 27/14618; H01L 31/02005; H01L 31/0203; H01L 24/49; H01L 2224/32225; H01L 2224/48091; H01L 2224/48106; H01L 2224/48227; H01L 2224/49176; H01L 2224/73265; H01L 24/85; H01L 24/45; H01L 2224/45144; H01L 2224/45147; H01L 2224/45139; H01L 2224/45015; H01L 2224/05553; H01L 2224/49175;
(Continued)

(56) References Cited

U.S. PATENT DOCUMENTS

| | | |
|---|---|---|
| 6,545,332 B2 | 4/2003 | Huang |
| 6,767,753 B2 | 7/2004 | Huang |

(Continued)

FOREIGN PATENT DOCUMENTS

| | | |
|---|---|---|
| CN | 1996592 A | 7/2007 |
| CN | 101009229 A | 8/2007 |

(Continued)

*Primary Examiner* — Mohammad M Hoque

(57) ABSTRACT

The present application provides a chip package structure and an electronic device, which could reduce a chip package thickness and implement ultra-thinning of chip package. The chip package structure includes a chip, a substrate, a lead and a lead protection adhesive; the lead is configured to electrically connect the chip and the substrate; the lead protection adhesive is configured to support the lead, where a highest point of the lead protection adhesive is not higher than a highest point of an upper edge of the lead.

20 Claims, 7 Drawing Sheets

(51) Int. Cl.
　　　*H01L 23/00*　　　(2006.01)
　　　*H01L 31/02*　　　(2006.01)
　　　*H01L 31/0203*　　(2014.01)
　　　*G06V 40/13*　　　(2022.01)

(52) U.S. Cl.
　　　CPC .............. *H01L 24/48* (2013.01); *H01L 24/73* (2013.01); *H01L 27/14618* (2013.01); *H01L 31/0203* (2013.01); *H01L 31/02005* (2013.01); *H01L 24/49* (2013.01); *H01L 2224/32225* (2013.01); *H01L 2224/48091* (2013.01); *H01L 2224/48106* (2013.01); *H01L 2224/48227* (2013.01); *H01L 2224/49176* (2013.01); *H01L 2224/73265* (2013.01)

(58) Field of Classification Search
　　　CPC ....... H01L 2224/18; H01L 2224/48479; H01L 2224/48471; H01L 2224/8592; H01L 2224/48465; H01L 23/49838; H01L 24/47; H01L 24/42; H01L 2924/00; H01L 2924/00014; H01L 2224/05013; H01L 23/3171; H01L 23/3185; H01L 2224/48228; H01L 2224/48491; G06K 9/0004; G06K 9/00053
　　　USPC .......................................................... 257/40
　　　See application file for complete search history.

(56) References Cited

U.S. PATENT DOCUMENTS

| | | | | |
|---|---|---|---|---|
| 2001/0052785 A1* | 12/2001 | Farnworth | ........... | G01R 1/0483 |
| | | | | 324/756.02 |
| 2002/0093026 A1 | 7/2002 | Huang | | |
| 2003/0103339 A1 | 6/2003 | Huang | | |
| 2003/0170933 A1 | 9/2003 | Manansala | | |
| 2004/0140420 A1 | 7/2004 | Dai et al. | | |
| 2005/0205981 A1* | 9/2005 | Yoshimura | ............. | H01L 25/03 |
| | | | | 257/686 |
| 2006/0138441 A1 | 6/2006 | Kromotis et al. | | |
| 2007/0152345 A1 | 7/2007 | Wu et al. | | |
| 2009/0218698 A1 | 9/2009 | Lam | | |
| 2010/0164083 A1* | 7/2010 | Yim | ................... | H01L 23/3135 |
| | | | | 257/686 |
| 2011/0171777 A1 | 7/2011 | Muto | | |
| 2013/0005086 A1 | 1/2013 | Muto | | |
| 2013/0285240 A1* | 10/2013 | Last | .................... | H01L 21/485 |
| | | | | 257/738 |
| 2013/0320463 A1* | 12/2013 | Chang | ................... | H01L 24/94 |
| | | | | 257/415 |
| 2014/0127860 A1 | 5/2014 | Muto | | |
| 2015/0243571 A1 | 8/2015 | Tsai et al. | | |
| 2016/0056124 A1 | 2/2016 | Muto | | |
| 2016/0171271 A1* | 6/2016 | Lundahl | ............ | G06V 40/1329 |
| | | | | 382/124 |
| 2017/0073218 A1* | 3/2017 | Kaanta | .................. | B81B 7/0048 |
| 2020/0311376 A1* | 10/2020 | Kim | ..................... | G06V 10/147 |

FOREIGN PATENT DOCUMENTS

| | | | |
|---|---|---|---|
| CN | 101930943 A | | 12/2010 |
| CN | 201689235 U | * | 12/2010 |
| CN | 103219324 A | | 7/2013 |
| CN | 104183560 A | * | 12/2014 |
| CN | 204463156 U | | 7/2015 |
| CN | 204576541 U | | 8/2015 |
| CN | 107146779 A | | 9/2017 |
| CN | 107195597 A | | 9/2017 |
| CN | 108630626 A | | 10/2018 |
| CN | 210052734 U | | 2/2020 |
| JP | H08186137 A | | 7/1996 |
| JP | 10261741 A | * | 9/1998 |
| JP | 2002299357 A | | 10/2002 |
| WO | 2019031513 A1 | | 2/2019 |

* cited by examiner

CHIP PACKAGE STRUCTURE, ELECTRONIC DEVICE AND METHOD FOR PREPARING A CHIP PACKAGE STRUCTURE

CROSS-REFERENCE TO RELATED APPLICATIONS

This application is a continuation in part of International Application No. PCT/CN2019/091235, filed on Jun. 14, 2019, the disclosure of which is hereby incorporated by reference in its entirety.

TECHNICAL FIELD

The present application relates to the technical field of optical fingerprints, and in particular, to a chip package structure and an electronic device and a method for preparing a chip package structure.

BACKGROUND

At present, in a process of packaging an electronic chip, two manners are generally adopted for packaging a lead: molding package and dispensing package. A common dispensing package method is to completely wrap a first solder joint, a second solder joint of a lead and the lead with a protection adhesive, so as to play a protective role. Therefore, in this dispensing package method, a height of the protection adhesive needs to be higher than a height of the lead thereby occupying entire thickness space of a packaged product, which is not conducive to development of ultra-thinning of a product.

SUMMARY

Embodiments of the present application provide a chip package structure and an electronic device and a method for preparing a chip package structure, which could reduce a chip package thickness and implement ultra-thinning of chip package.

According to a first aspect, provided is a chip package structure, including: a chip, a substrate, a lead and a lead protection adhesive;

where the lead is configured to electrically connect the chip and the substrate;

the lead protection adhesive is configured to support the lead, where a highest point of the lead protection adhesive is not higher than a highest point of an upper edge of the lead.

According to a solution of an embodiment of the present application, a height of a lead protection adhesive is controlled such that a highest point of the lead protection adhesive is not higher than a highest point of the lead and the lead protection adhesive can support the lead, thereby avoiding an increase in an additional thickness of a chip package product and implementing ultra-thinning of the product while the lead protection adhesive may ensure mechanical reliability of the lead.

In one possible implementation manner, the highest point of the lead protection adhesive is not lower than a highest point of a lower edge of the lead.

In one possible implementation manner, the lead protection adhesive covers a lower edge of the lead.

In one possible implementation manner, the chip is an optical fingerprint sensor chip, and is configured to receive a fingerprint detection signal returned by reflection or scattering of a human finger and detect fingerprint information of the finger based on the fingerprint detection signal.

In one possible implementation manner, the chip includes a pin pad and the substrate includes a substrate pad; and the lead is configured to electrically connect the pin pad and the substrate pad.

In one possible implementation manner, the lead protection adhesive covers a first solder joint formed on the substrate pad by the lead and a second solder joint formed on the pin pad by the lead, and is configured to protect the first solder joint and the second solder joint.

In one possible implementation manner, the lead is connected to the pin pad through a metal ball.

In one possible implementation manner, the lead and the metal ball are of an integral structure.

In one possible implementation manner, a first segment of the lead in the lead is located above the chip, and a distance between a lowest point of the first segment of the lead and an upper surface of the chip is not greater than 10 µm.

In one possible implementation manner, the lowest point of the first segment of the lead is in contact with the upper surface of the chip.

In one possible implementation manner, a distance between the highest point of the lead and an upper surface of the chip is not greater than 35 µm.

In one possible implementation manner, the chip package structure further comprises a chip attaching adhesive, which connects the chip and the substrate;

a thickness of the chip is between 50 µm and 600 µm, a thickness of the substrate is between 100 µm and 350 µm, and a thickness of the chip attaching adhesive is between 10 µm and 35 µm.

In one possible implementation manner, the chip further includes: a test metal unit; and the test metal unit is disposed in an edge region of the chip that is not under the lead.

In one possible implementation manner, the pin pad is located on one side of the chip, and the test metal unit is located on at least one side of other three sides of the chip.

In one possible implementation manner, the lead is a lead fabricated from the substrate pad to the pin pad by employing a reverse wire bonding process.

In one possible implementation manner, the lead is a gold wire, silver wire or copper wire; and/or the lead has a wire diameter of 15.2 µm to 25.4 µm.

In one possible implementation manner, the chip is disposed on an upper surface of the substrate.

In another possible implementation manner, an upper surface of the substrate extends downward to form a first groove, and at least a portion of the chip is disposed in the first groove.

In one possible implementation manner, a size of the first groove is greater than a size of the chip such that there is a gap for accommodating the lead between a side wall of the chip and a side wall of the first groove.

In one possible implementation manner, a depth of the first groove includes a thickness of a cover film of the substrate and a thickness of a conductive layer located under the cover film.

According to a second aspect, provided is an electronic device, including:

the chip package structure, comprising: a chip, a substrate, a lead and a lead protection adhesive;

wherein the lead is configured to electrically connect the chip and the substrate;

the lead protection adhesive is configured to support the lead, wherein a highest point of the lead protection adhesive is not higher than a highest point of an upper edge of the lead.

According to a third aspect, provided is a method for preparing a chip package structure, including:

forming a lead, the lead is configured to electrically connect a chip and a substrate;

a lead protection adhesive covers a first solder joint formed on a substrate pad by the lead, and a tension of the lead protection adhesive causes the lead protection adhesive to climb up along the lead until the lead protection adhesive covers a second solder joint formed on the pin pad by the lead.

DESCRIPTION OF EMBODIMENTS

Technical solutions in embodiments of the present application will be described hereinafter with reference to the accompanying drawings.

An embodiment of the present application is applicable to various chips (Microchip), also referred to as integrated circuits (integrated circuit, IC) or microcircuits (Microcircuit), which are circuit structures integrated by a plurality of semiconductor devices that are generally fabricated on semiconductor wafers by semiconductor integration circuit processes through steps such as thin film deposition, doping, photolithography and etching. The chip includes, but is not limited to, a sensor chip, a power supply chip, a signal processing chip, a logic control chip, a memory chip, and the like.

In an embodiment of the present application, the chip may be a fingerprint sensor chip, and is configured to receive a fingerprint signal such as a light wave signal, an acoustic wave signal, or a pressure signal that carries fingerprint information, and convert the fingerprint signal into a corresponding electrical signal, so as to detect fingerprint information of a finger. The fingerprint sensor chip includes, but is not limited to, an optical fingerprint sensor chip, an ultrasonic fingerprint sensor chip, or a capacitive fingerprint sensor chip. For convenience of illustration, an optical fingerprint sensor chip is illustrated hereinafter as an example.

As a common application scenario, the optical fingerprint sensor chip provided in an embodiment of the present application may be applied to a smart phone, a tablet computer, and other mobile terminals having a display screen or other terminal devices. More specifically, in the foregoing terminal devices, the optical fingerprint sensor chip may be specifically disposed in an optical fingerprint apparatus, which may be disposed in a partial region or an entire region under the display screen, thereby forming an under-display optical fingerprint system. Alternatively, the optical fingerprint identification apparatus may be partially or entirely integrated into an interior of the display screen of the terminal device to form an in-display optical fingerprint system.

Figure 1:
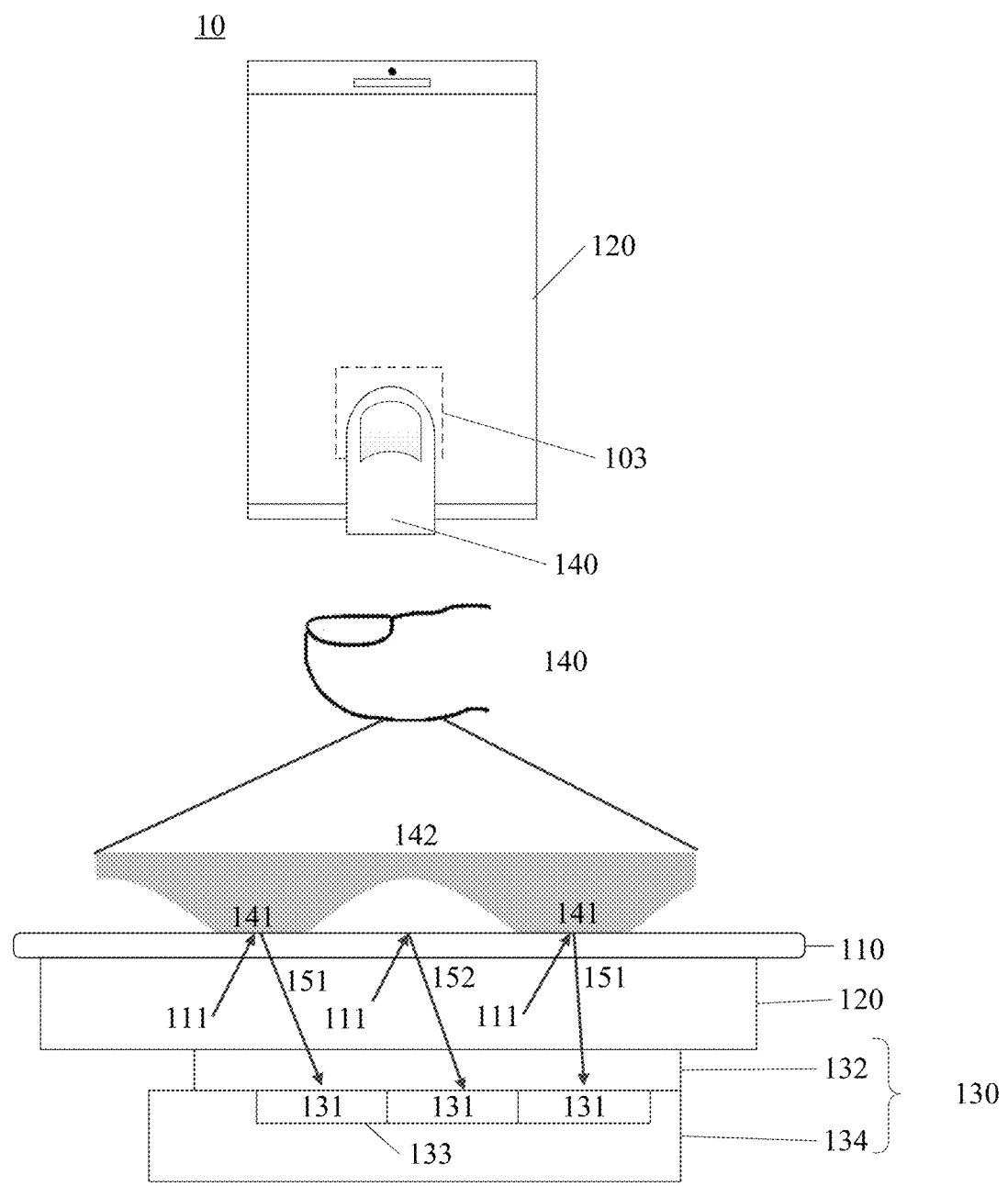
FIG. 1 is a schematic structural diagram of a terminal device to which an embodiment of the present application is applied.

FIG. 1 illustrates a schematic structural diagram of a terminal device to which an embodiment of the present application may be applied. The terminal device 10 includes a display screen 120 and an optical fingerprint apparatus 130, where the optical fingerprint apparatus 130 is disposed in a partial region under the display screen 120. The optical fingerprint apparatus 130 includes a fingerprint detection region 103. A light signal reflected or scattered by a region in the fingerprint detection region 103 where a finger is located may be received and detected by the optical fingerprint apparatus 130. As illustrated in FIG. 1, the fingerprint detection region 103 is located in a display region of the display screen 120. In an alternative embodiment, the optical fingerprint apparatus 130 may also be disposed at other positions, such as a side of the display screen 120 or a non-light transmitting region of an edge of the terminal device 10, and a light signal of at least part of the display region of the display screen 120 is guided to the optical fingerprint apparatus 130 through a light path design, such that the fingerprint detection region 103 is actually located in the display region of the display screen 120.

It should be understood that an area of the fingerprint detection region 103 may be different from an area of a sensing array of the optical fingerprint apparatus 130. For example, the area of the fingerprint detection region 103 of the optical fingerprint apparatus 130 may be larger than the area of the sensing array of the optical fingerprint apparatus 130 through, for example, a lens imaging light path design, a reflective folding light path design or other light path designs such as light convergence or reflection. In other alternative implementation manners, if the light path is directed in a manner of, for example, light collimation, the area of the fingerprint detection region 103 of the optical fingerprint apparatus 130 may also be designed to be substantially identical with the area of the sensing array of the optical fingerprint apparatus 130.

Thus, when a user needs to unlock the terminal device or perform other fingerprint verification, a fingerprint input may be implemented merely by pressing a finger on the fingerprint detection region 103 located on the display screen 120. Since fingerprint detection may be implemented in the display, there is no need to exclusively reserve space for a front surface of the terminal device 10 adopting the foregoing structure to set a fingerprint button (such as a Home button), so that a full screen solution may be adopted; that is, the display region of the display screen 120 may be substantially extended to an entire front surface of the terminal device 10.

As an alternative implementation manner, as illustrated in FIG. 1, the optical fingerprint apparatus 130 includes a light detection portion 134 and an optical component 132. The light detection portion 134 includes the sensing array, a readout circuit and other auxiliary circuits electrically connected with the sensing array, which is fabricated in an optical fingerprint sensor chip by a semiconductor process; the sensing array is specifically a photo detector array including a plurality of photo detectors distributed in an array, and the photo detectors may be used as an optical sensing unit as described above. The optical component 132 may be disposed above the sensing array of the light detection portion 134, and may specifically include a filter layer, a light directing layer or a light path directing structure, and other optical elements; the filter layer may be used to filter ambient light passing through a finger; and the light directing layer or light path directing structure is mainly used to direct reflected light reflected from a finger surface to the sensing array for optical detection.

In specific implementation, the optical component 132 and the light detection portion 134 may be encapsulated in the same optical fingerprint member. For example, the optical component 132 and the light detection portion 134 may be encapsulated in the same optical fingerprint chip, or the optical component 132 may be disposed outside a chip where the light detection portion 134 is located; and for example, the optical component 132 is attached above the chip, or part of elements of the optical component 132 are integrated into the foregoing chip.

There are various implementation solutions for the light directing layer or light path directing structure of the optical component 132; for example, the light directing layer may be specifically a collimator layer fabricated on a semiconductor silicon wafer, which has a plurality of collimating units or micro-hole arrays; and the collimating unit may be a hole. Light in the reflected light reflected from the finger that is vertically incident to the collimating unit may pass through the collimating unit and be received by the optical sensing unit below it. However, light with an excessive large incident angle is attenuated through multiple reflection inside the collimating unit, thus, each optical sensing unit may basically only receive the reflected light reflected from a fingerprint pattern right above the optical sensing unit, and thus the sensing array may detect a fingerprint image of the finger.

In another embodiment, the light directing layer or light path directing structure may also be an optical lens layer having one or more lens units, for example, a lens group composed of one or more aspheric lenses, for converging reflected light reflected from the finger to the sensing array of the light detection portion 134 below it, so that the sensing array may perform imaging based on the reflected light so as to obtain the fingerprint image of the finger. Optionally, the optical lens layer may be provided with a pinhole in the light path of the lens unit, and the pinhole may cooperate with the optical lens layer to expand the field of view of the optical fingerprint apparatus, to improve a fingerprint imaging effect of the optical fingerprint apparatus 130.

In other embodiments, the light directing layer or light path directing structure may also specifically adopt a micro-lens layer having a micro-lens array constituted by a plurality of micro-lenses, which may be formed above the sensing array of the light detection portion 134 by a semiconductor growth process or other processes, and each micro-lens may correspond to one of the sensing units in the sensing array respectively. Furthermore, other optical film layers such as a dielectric layer or a passivation layer, may be formed between the micro-lens layer and the sensing unit, and more specifically, a light blocking layer having a micro-hole may also be formed between the micro-lens layer and the sensing unit, where the micro-hole is formed between the corresponding micro-lens and the sensing unit, and the light blocking layer may block optical interference between adjacent micro-lenses and the sensing unit, such that light corresponding to the sensing unit is converged to an interior of the micro-hole through the micro-lens and is transmitted to the sensing unit via the micro-hole to perform optical fingerprint imaging. It should be understood that several implementation solutions of the forgoing light path directing structure may be used alone or in combination; for example, a micro-lens layer may be further disposed under the collimator layer or the optical lens layer. Certainly, when the collimator layer or the optical lens layer is used in combination with the micro-lens layer, a specific laminated structure or light path may require to be adjusted according to actual needs.

It should be understood that, in a specific implementation, the terminal device 10 further includes a transparent protective cover; and the cover may be a glass cover or a sapphire cover, which is located above the display screen 120 and covers a front surface of the terminal device 10. This is because, in an embodiment of the present application, the so-called finger pressing the display screen 120 actually refers to the finger pressing the cover above the display screen 120 or a surface of a protective layer covering the cover.

As an optional embodiment, the display screen 120 may adopt a display screen with a self-emitting display unit, such as an organic light emitting diode (Organic Light-Emitting Diode, OLED) display screen or a micro light emitting diode (Micro-LED) display screen. Taking the OLED display screen that is adopted as an example, the optical fingerprint apparatus 130 may use the display unit (that is, an OLED light source) of the OLED display screen 120 located in the fingerprint detection region 103 as an excitation light source for optical fingerprint detection. When a finger 140 presses a fingerprint detection region 103, the display screen 120 emits a beam of light 111 to the target finger 140 above the fingerprint detection region 103, and the light 111 is reflected on an upper surface of a cover 110 to form reflected light, where a finger ridge closely contacts the cover 110 with no gap, and there is a certain air gap between a finger valley and the cover 110, and thus, reflectance of the light 111 on a region where the finger ridge contacts the cover is 0, and reflectance of the light 111 on a region where the finger valley contacts the cover is 4%. Thus, light intensity of reflected light 151 formed by the light 111 that is reflected on the region where the finger ridge contacts the cover is smaller than that of reflected light 152 formed by the light 11 that is reflected on the region where the finger valley contacts the cover. After passing through the optical component 132, the reflected light is received by the sensing array 134 in the optical fingerprint apparatus 130 and converted into a corresponding electrical signal, that is, a fingerprint detection signal; and fingerprint image data may be obtained based on the fingerprint detection signal, and fingerprint matching verification may be further performed, thereby implementing an optical fingerprint identification function at the terminal device 10.

In other embodiments, the optical fingerprint apparatus 130 may also adopt a built-in light source or an external light source to provide a light signal for fingerprint detection. In this case, the optical fingerprint apparatus 130 may be applicable to a non-self-emitting display screen, such as a liquid crystal display screen or other passive light-emitting display screens. Taking a liquid crystal display screen having a backlight module and a liquid crystal panel as an example, in order to support under-display fingerprint detection of the liquid crystal display screen, the optical fingerprint system of the terminal device 10 may further include an excitation light source for optical fingerprint detection. The excitation light source may specifically be an infrared light source or a light source of non-visible light with a specific wavelength, which may be disposed under the backlight module of the liquid crystal display screen or disposed in an edge region under a protective cover of the terminal device 10. The optical fingerprint apparatus 130 may be disposed under the liquid crystal panel or the edge region of the protective cover, and light for fingerprint detection may reach the optical fingerprint apparatus 130 by being directed by a light path. Optionally, the optical fingerprint apparatus 130 may also be disposed under the backlight module, and the backlight module allows the light for fingerprint detection to pass through the liquid crystal panel and the backlight module and reach the optical fingerprint apparatus 130 by providing a hole on film layers such as a diffusion sheet, a brightening sheet, a reflection sheet or the like, or by performing other optical designs. When the optical fingerprint apparatus 130 is applied to adopt a built-in light source or an external light source to provide a light signal for fingerprint detection, a detection principle is consistent with the foregoing description.

On the other hand, in some embodiments, the optical fingerprint apparatus 130 may only include one optical fingerprint sensor chip; and in this case, the fingerprint detection region 103 of the optical fingerprint apparatus 130 has a smaller area and a fixed position; and thus, when an fingerprint input is performed, the user needs to press the finger at a specific position of the fingerprint detection region 103, otherwise the optical fingerprint apparatus 130 may not be able to capture the fingerprint image, thereby resulting in poor user experience. In other alternative embodiments, the optical fingerprint apparatus 130 may specifically include a plurality of optical fingerprint sensor chips which may be disposed under the display screen 120 side by side in a splicing manner, and sensing regions of the plurality of optical fingerprint sensor chips collectively constitute the fingerprint detection region 103 of the optical fingerprint apparatus 130. In other words, the fingerprint detection region 103 of the optical fingerprint apparatus 130 may include a plurality of sub-regions, each sub-region respectively corresponding to a sensing region of one of the optical fingerprint sensor chips, so that the fingerprint capturing region 103 of the optical fingerprint apparatus 130 may be extended to a main region of a lower portion of the display screen, that is, extended to a generally pressed region by the finger, thereby implementing a blind pressing type of a fingerprint input operation. Alternatively, when the number of the optical fingerprint sensor chips is sufficient, the fingerprint detection region 103 may further be extended to half of the display region or even the entire display region, thereby implementing half-screen or full-screen fingerprint detection.

It should also be understood that in an embodiment of the present application that, the sensing array in the optical fingerprint apparatus may also be referred to as a pixel array, and the optical sensing unit or sensing unit in the sensing array may also be referred to as a pixel unit.

It should be noted that the optical fingerprint apparatus in an embodiment of the present application may also be referred to as an optical fingerprint identification module, a fingerprint identification apparatus, a fingerprint identification module, a fingerprint module, a fingerprint acquisition apparatus, and the like, and the foregoing terms may be replaced with each other.

Generally, the optical component 132 and the optical detection portion 134 may be packaged together as an optical fingerprint sensor chip 210 or the optical detection portion 134 may be packaged separately as an optical fingerprint sensor chip. For convenience of description, the optical fingerprint sensor chip may also be referred to as a chip hereinafter.

Generally, after the chip is fabricated on the wafer, the chip is packaged on the circuit board, which plays a role in placing, fixing, sealing, protecting the chip and enhancing electric heating performance. In addition, the chip is connected to an external circuit through the package.

Figure 2:
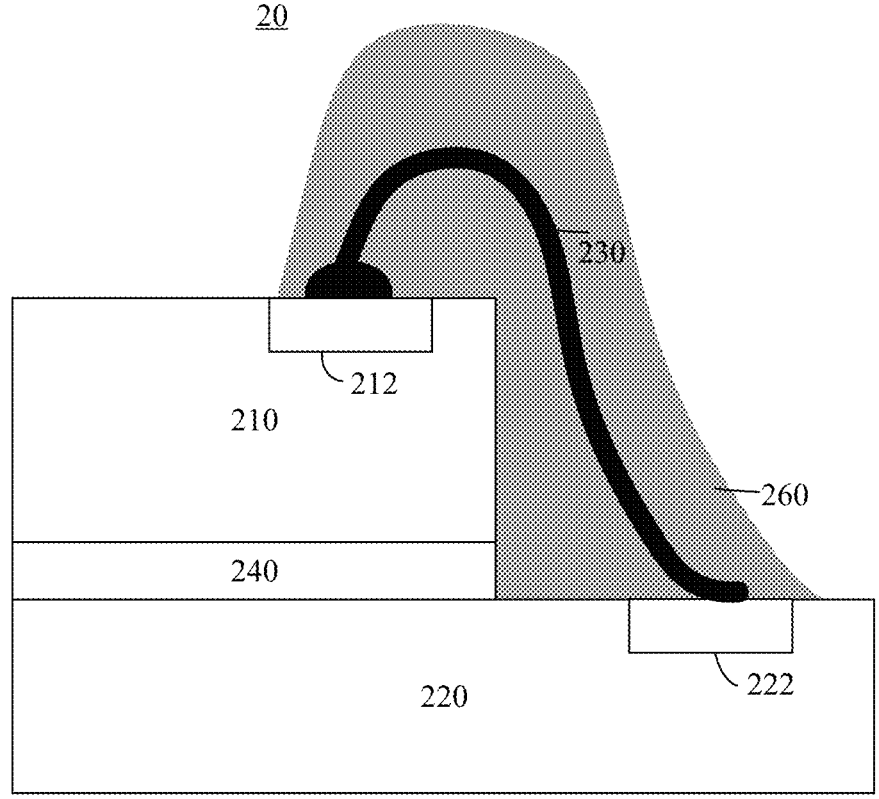
FIG. 2 is a schematic diagram of a chip package structure according to an embodiment of the present application.

FIG. 2 is a schematic diagram of a chip package structure 20. As shown in FIG. 2, a chip 210 is attached and fixed to a substrate 220 by a chip attaching adhesive 240, the chip 210 is provided with a pin pad 212, a substrate pad 222 is formed on the substrate 220, and a lead 230 implements an electrical connection between the chip 210 and the substrate 220 by connecting the pin pad 212 and the substrate pad 222. Specifically, in a process of soldering to form the lead 230, the lead 230 forms a first solder joint on the pin pad 212 and a second solder joint on the substrate pad 222.

In an existing package manner, as shown in FIG. 2, after the lead 230 is fabricated, dispensing is performed on the lead 230 and the first solder joint and the second solder joint formed by soldering through a dispensing process to form a sealing protection adhesive 260 that completely covers the lead 230, the first solder joint and the second solder joint. A dispensing amount of the protection adhesive 260 is larger, and a height of the protection adhesive 260 is generally much higher than a height of the lead 230, so as to ensure that the lead can be completely covered and protected. However, if this dispensing manner is employed, a thickness of the chip package structure 20 is increased, which is not conducive to achieving ultra-thinning of a chip package structure.

Based on this, according to an embodiment of the present application, a height of a protection adhesive is controlled such that a highest point of the protection adhesive is not higher than a highest point of the lead and the protection adhesive can support the lead, thereby avoiding an increase in an additional thickness of a chip package product and implementing ultra-thinning of the product while the protection adhesive may ensure mechanical reliability of the lead.

Chip package structures of embodiments of the present application will be described in detail below with reference to FIGS. 3-13.

It should be noted that in the embodiments illustrated below, the same structure is denoted by the same reference numeral for ease of understanding, and detailed description of the same structure is omitted for brevity.

Figure 3:
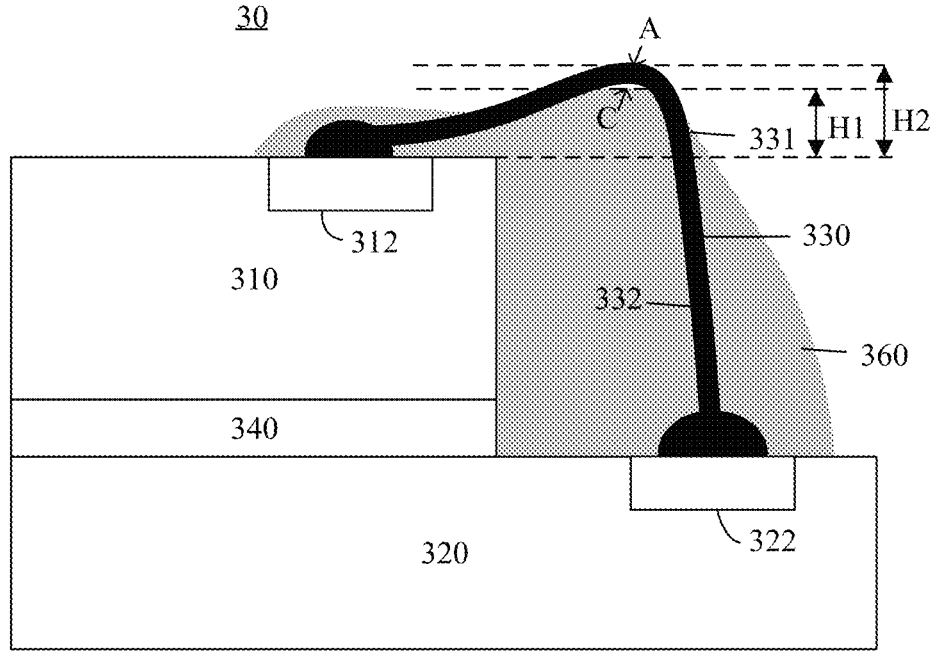
FIG. 3 is a schematic diagram of another chip package structure according to an embodiment of the present application.

FIG. 3 is a schematic structural diagram of a chip package structure 30 according to an embodiment of the present application. The chip package structure 30 includes a chip 310, a substrate 320, a lead 330 and a lead protection adhesive 360;

where the lead 330 is configured to electrically connect the chip 310 and the substrate 320;

the lead protection adhesive 360 is configured to support the lead 330, where a highest point of the lead protection adhesive 360 is not higher than a highest point of an upper edge 331 of the lead.

Specifically, in an embodiment of the present application, dispensing is performed on the lead 330 by using the lead protection adhesive 360 through a semiconductor adhesive dispensing process. As shown in FIG. 3, the lead protection adhesive 360 is disposed under the lead 330 to support the lead 330. Furthermore, the highest point of the lead protection adhesive 360 is not higher than the highest point of the upper edge 331 of the lead 330, where the upper edge 331 of the lead 330 is an upper edge of the lead in a radial direction, that is, an upper edge of a maximum radial cross section of the lead 330.

As shown in FIG. 3, a height of a highest point C of the lead protection adhesive 360 may be denoted as a distance H1 between a plane where the highest point C is located and an upper surface of the chip 310. A highest point A of the upper edge 331 of the lead 330 may also be denoted as a distance H2 between a plane where the highest point A is located and the upper surface of the chip 310. When the highest point C of the lead protection adhesive 360 is not higher than the highest point A of the upper edge 331 of the lead, that is, H1 is less than H2, the lead protection adhesive 360 does not make an increase in an additional thickness of the chip package structure 30, and the chip package structure 30 can be thinned.

In the embodiment of the present application, the chip 310 may be the same as the chip 210 in FIG. 2. The chip 310 is an integrated circuit fabricated on a semiconductor wafer through a semiconductor integrated circuit process, and includes a circuit region and a non-circuit region, where the circuit region is located at the center of the chip 310, and the non-circuit region is located in a peripheral edge of the chip 310.

Optionally, the chip 310 is a fingerprint sensor chip, and is configured to receive a fingerprint signal such as a light wave signal, an acoustic wave signal or a pressure signal that carries fingerprint information and convert the fingerprint signal into a corresponding electrical signal, so as to detect fingerprint information of a finger. The chip 310 includes, but is not limited to, an optical chip, an ultrasonic chip, or a capacitor chip or the like.

Specifically, when the chip 310 is an optical fingerprint sensor chip, it is configured to receive a fingerprint detection signal returned by reflection or scattering of a human finger and detect fingerprint information of the finger based on the fingerprint detection signal. Optionally, the chip 310 may include a light detection portion 134 in FIG. 1, or include a light detection portion 134 and an optical component 132. For example, when the optical component 132 is a micro-lens array and a pinhole array, the micro-lens array and the pinhole array may be directly grown on a surface of the light detection portion 134, and the optical component 132 and the light detection portion 134 may be packaged together as a chip. It should be understood that when the chip 310 is an optical fingerprint sensor chip, the chip package structure 30 may be a fingerprint identification apparatus.

Optionally, as shown in FIG. 3, the chip 310 is adhered to an upper surface of the substrate 320 by the chip attaching adhesive 340.

Figure 4:
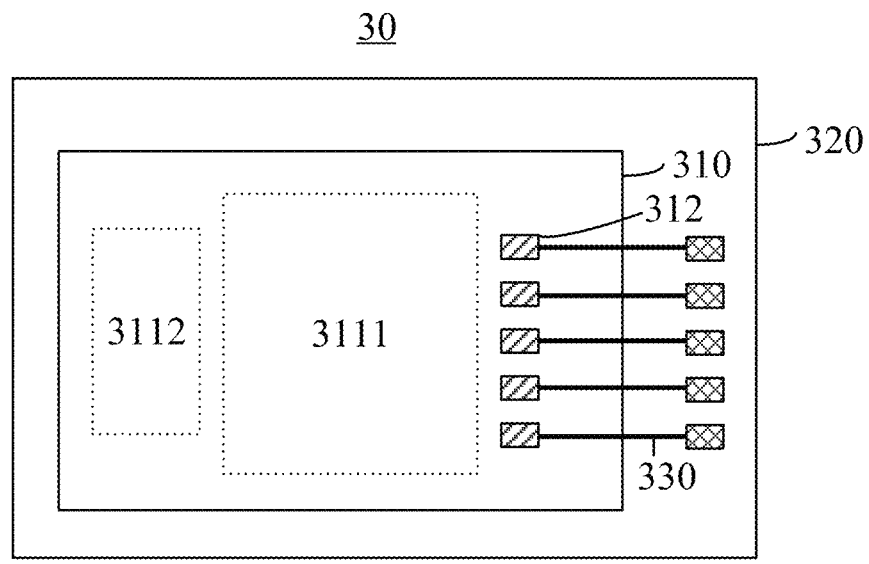
FIG. 4 is a schematic plan view of a chip package structure according to an embodiment of the present application.

Optionally, FIG. 4 is a schematic plan view of a chip package structure according to an embodiment of the present application. As shown in FIG. 4, the chip 310 includes a detection circuit including a light detection array 3111 and a functional circuit 3112, and the light detection array 3111 is configured to receive a fingerprint detection light signal returned by reflection or scattering of a finger and obtain a fingerprint detection electrical signal of the finger based on the fingerprint detection light signal.

Optionally, the light detection array 3111 includes a plurality of pixel units, one pixel unit is configured to convert a light signal to form a fingerprint detection electrical signal, and one fingerprint detection electrical signal corresponds to one pixel value in a fingerprint image. The pixel unit may be a photo diode, a metal oxide semiconductor field effect transistor (Metal Oxide Semiconductor Field Effect Transistor, MOSFET) and other devices, and has higher light sensitivity and higher quantum efficiency to light at a target wavelength so as to facilitate detection of a light signal at a corresponding wavelength. In one possible implementation manner, the target wavelength belongs to an infrared light band, and the light detection array is configured to receive a fingerprint infrared light signal reflected by the finger to form a corresponding fingerprint electrical signal.

Optionally, the functional circuit 3112 includes, but is not limited to, a drive control circuit, a signal output circuit, or the like, and is configured to control a plurality of pixel units in the light detection array to operate and output electrical signals generated by the plurality of pixel units.

Specifically, the pin pad 312 is configured to output the fingerprint electrical signal generated by the detection circuit to the substrate 320 through the lead 330, to transmit the fingerprint electrical signal to other processing circuit units on the substrate. The processing circuit unit includes, but is not limited to, a logic control circuit, an analog-to-digital conversion circuit, a signal processing circuit, a digital processing circuit, or the like.

Optionally, the pin pad 312 is further configured to receive a control signal generated by other control processing circuits on the substrate 320. Optionally, the control signal may be generated by a control unit on the substrate 320 such as a microcontroller.

Optionally, in the embodiment of the present application, the substrate 320 includes, but is not limited to, a printed circuit board (Printed Circuit Board, PCB), a flexible printed circuit board (Flexible Printed Circuit board, FPC), or a flexible and rigid combination board, or the like, and is configured to carry and connect a plurality of electronic devices and chips. The chip package structure 30 packaged with the substrate 320 may implement functions such as fingerprint identification of a fingerprint sensor chip, processing of a fingerprint image.

Figure 5:
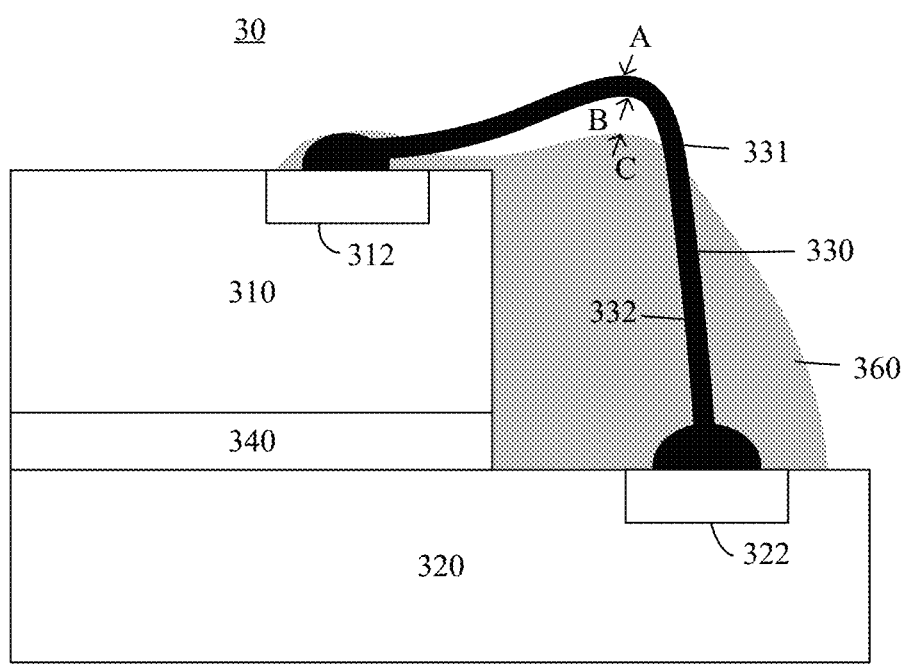
FIG. 5 is a schematic structural diagram of another chip package structure according to an embodiment of the present application.

Optionally, as shown in FIG. 5, when a highest point C of a lead protection adhesive 360 is not higher than a highest point A of an upper edge of a lead 330, the highest point C of the lead protection adhesive 360 is not higher than a highest point B of a lower edge 332 of the lead 330, where the lower edge 332 of the lead 330 is a lower edge of the lead in a radial direction, that is, a lower edge of a maximum radial cross section of the lead 330. At this time, the lead protection adhesive 360 has a less dispensing amount, and a lower height, and can also support the lead.

Figure 6:
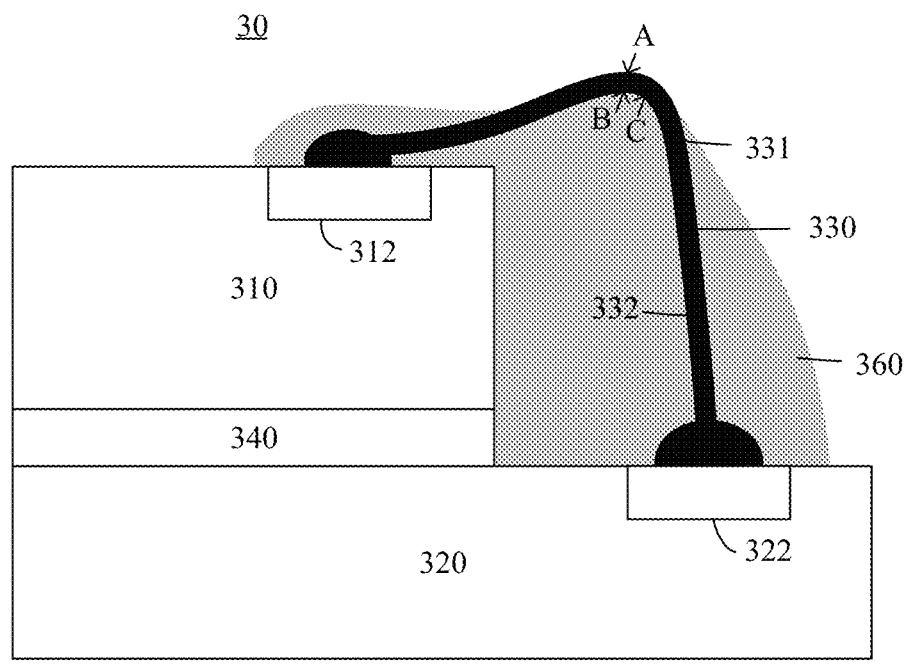
FIG. 6 is a schematic structural diagram of another chip package structure according to an embodiment of the present application.

Preferably, as shown in FIG. 6, when a highest point C of a lead protection adhesive 360 is not higher than a highest point A of an upper edge of a lead 330, the highest point C of the lead protection adhesive 360 is not lower than a highest point B of a lower edge 332 of the lead 330, the lead protection adhesive 360 can fully support the lead 330, to ensure that the lead 330 is not broken due to external pressure and has good mechanical reliability.

Preferably, as shown in FIG. 6, the lead protection adhesive 360 covers the lower edge of the lead 330, but does not cover the upper edge of the lead 330, that is, the lower edge of the lead 330 is completely in the lead protection adhesive 360, but part of the upper edge of the lead 330 is exposed beyond the lead protection adhesive 360. At this time, the lead 330 can be completely supported by the lead protection adhesive 360, and a height of the lead protection adhesive 360 is not higher than a height of the lead 330, which could reduce a thickness of the chip package structure 30 on the premise of ensuring good mechanical reliability of the lead.

Specifically, a chip 310 includes at least one pin pad 312, and a substrate includes at least one substrate pad 322. Hereinafter, the number of the pin pads 312 may be one or more, and the number of the substrate pads 322 may be one or more.

One pin pad 312 is correspondingly connected to one lead 330, and a plurality of pin pads 312 are correspondingly connected to a plurality of leads 330, respectively. The lead 330 is specifically configured to electrically connect the chip 310 and the substrate 320 by connecting the pin pad 312 and the substrate pad 322.

Optionally, the pin pad 312 may be a metal pad such as a circular or square pad formed of metal copper. The substrate pad 332 may be a metal copper pad on the substrate or a connecting finger of the substrate. The lead 330 may be a gold (Au) wire, a copper (Cu) wire, a silver (Ag) wire, or other metal wires and alloy wires. The lead 330 may have a wire diameter between 15.2 μm and 25.4 μm, which is not limited in the embodiment of the present application.

Optionally, the lead protection adhesive 360 completely covers a first solder joint formed on the substrate pad 322 by the lead 330 and a second solder joint formed on the pin pad 312 by the lead, and is configured to protect the first solder joint and the second solder joint, and prevent the first solder joint and the second solder joint from being corroded by water vapor or other external environmental factors, thereby ensuring good environmental reliability.

Optionally, during a dispensing process, dispensing is performed at a wire arc of the lead 330, and a dispensing amount is controlled so that the lead protection adhesive 360 flows to the first solder joint on the substrate pad 322 and the second solder joint on the pin pad 312 through its own adhesive fluidity, and completely covers and protects the two solder joints.

Optionally, the lead protection adhesive covers the first solder joint, and a tension of the lead protection adhesive causes the lead protection adhesive to climb up along the lead until the lead protection adhesive covers the second solder joint. Specifically, the lead protection adhesive is a thermosetting adhesive, which has the characteristics of initially being in a flowing state and solidifying to a solid state after baking (a lead protection adhesive may also be an adhesive cured by ultraviolet light). The lead protection adhesive is in a liquid state before curing. After covering the first solder joint, due to a surface tension and the capillary phenomenon of the liquid, the lead protection adhesive climbs up the lead until it covers the second solder joint. In order to achieve better protection of the lead, a lead protection adhesive with better fluidity is generally selected. At the same time, plasma cleaning is performed on the product before dispensing to activate the surface energy of the lead, so that the lead protection adhesive can climb smoothly.

Optionally, a wire bonding technology is adopted to fabricate the lead 330 so as to connect the pin pad 312 and the substrate pad 322.

Optionally, in the embodiment of the present application, an arc height H of the lead 330 fabricated by the wire bonding technology may be any value, that is, a distance H between a plane where a highest point of the lead 330 is located and a surface of the chip 310 may be any value. Specifically, a value of the arc height H is related to a process parameter of the wire bonding.

The wire bonding technology includes two forms: ball bonding and wedge bonding. Basic steps of the two bonding technologies include: forming a first solder joint, forming a lead, and finally forming a second solder joint. In an embodiment of the application, the ball bonding or wedge bonding may be adopted for soldering; and the two bonding technologies differ in a solder head and a manner of guiding a metal wire, but are substantively the same in specific soldering steps. An example of the ball bonding is illustrated hereinafter.

Specifically, connecting the first solder joint and the second solder joint by a ball bonding method includes the following steps:

(1) igniting or discharging on a metal wire to form a metal ball;

(2) placing the metal ball on a first pad, and applying a certain pressure on the first pad to form a first solder joint on the first pad by thermal ultrasound;

(3) guiding the metal wire to extend upward to form a longitudinal wire neck of a lead;

(4) guiding the lead to bend and extend laterally to a second pad to form a wire arc of the lead;

(5) forming a second solder joint at the second pad by thermal ultrasound; and (6) lifting and breaking off the metal wire, re-igniting or re-discharging to form a new metal ball.

When a first pad is a pin pad 312 on a chip and a second pad is a substrate pad 322 on a substrate, a process of connecting the first pad and the second pad by using the foregoing ball bonding is generally referred to as forward wire bonding (forward loop); and when a first pad is a substrate pad 322 on a substrate and a second pad is a pin pad 312 on a chip, the process thereof is generally referred to as reverse wire bonding (reverse loop). Since the lead needs to extend upward at the first pad to form a wire neck and bend to form a wire arc, there is a limitation on an arc height of a wire arc above the first pad, and if the arc height is reduced, the wire neck will break off due to excessive bending, thereby resulting in lower reliability.

Figure 7:
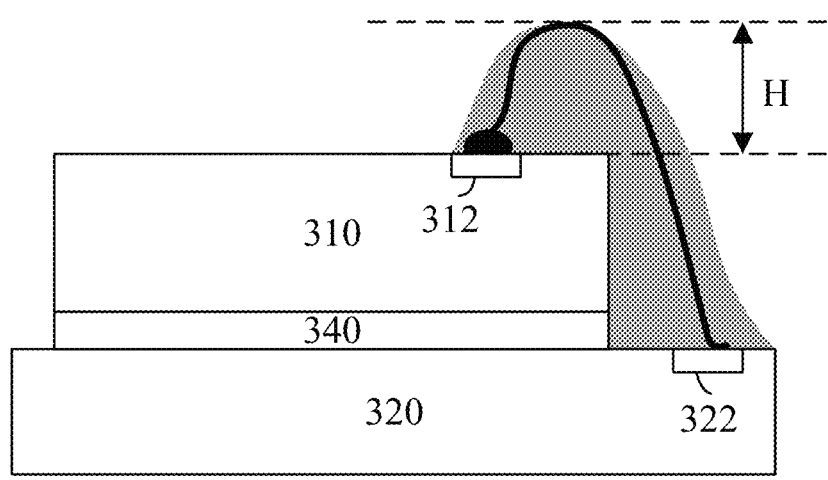
FIG. 7 is a schematic structural diagram of another chip package structure according to an embodiment of the present application.
Figure 8:
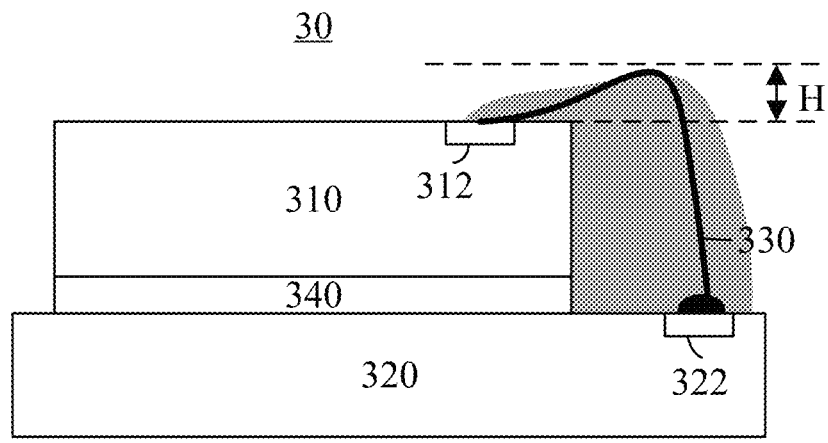
FIG. 8 is a schematic structural diagram of another chip package structure according to an embodiment of the present application.

Generally, the chip 310 is disposed above the substrate 320, and therefore an upper surface of the pin pad 312 is higher than an upper surface of the substrate pad 322. When the forward wire bonding is adopted, as shown in FIG. 7, the pin pad 312 is a first pad, and there is a limitation on an arc height H above the pin pad 312, thereby resulting in that a thickness of the chip package structure is limited and increased. When the reverse wire bonding is adopted, as shown in FIG. 8, a substrate pad 322 is a first pad, since the lead itself needs to be pulled up and extended to a pin pad, a design of ultra-low arc height may be implementing by implementing bending of an arc in the pull-up and extension process; and compared with forward wire bonding, the arc height H is greatly reduced, and a ultra-low wire arc structure is implemented, so that a thickness of the chip package structure is not limited, facilitating implementing a thin chip package structure 30.

It should be understood that the solution of the embodiment of the present application may be applied to the lead 330 formed by the forward wire bonding, and may also be applied to the lead 330 formed by the reverse wire bonding, which is not limited in the embodiment of the present application.

Optionally, in an implementation manner of an ultra-low wire arc, the arc height H of the lead 330 is not greater than 35 μm, that is, the distance H between the plane where the highest point of the lead 330 is located and the surface of the chip 310 is not greater than 35 μm.

Optionally, a thickness of the chip 310 is generally 50 to 600 μm, a thickness of the substrate 320 is generally 100 to 350 μm, a thickness of the chip attaching adhesive 340 is generally 10 to 35 μm. Combined with the arc height of the lead 330 not more than 35 μm, the thickness of the entire chip package structure 30 can be controlled below 1 mm, which is conducive to compressing the space occupied by the chip package structure in the electronic equipment in which it is located, facilitating the thin and light development of the electronic equipment and improving the user experience.

Optionally, in one possible implementation manner, the reverse wire bonding is performed by using a stand-off stitch bond (Stand-off Stitch Bond, SSB) method to achieve an electrical connection. Specifically, a process of the SSB method is as follows:

(1) igniting or discharging on a gold wire to form a gold ball 350;

(2) placing the gold ball 350 on a pin pad 312;

(3) lifting and breaking off the gold wire, re-igniting or re-discharging on the gold wire to form a new gold ball;

(4) placing the gold ball on a substrate pad 322, and applying a certain pressure on the substrate pad 322 to form a first solder joint on the substrate pad 322 by thermal ultrasound;

(5) guiding the gold wire to extend upward to form a longitudinal wire neck;

(6) guiding the gold wire to bend and extend laterally to the pin pad 312 to form a wire arc;

(7) applying a certain pressure on the gold ball 350 to form a second solder joint on the pin pad 312 by thermal ultrasound; and (8) lifting and breaking off a lead, re-igniting or re-discharging on the gold wire to form a new gold ball.

Figure 9:
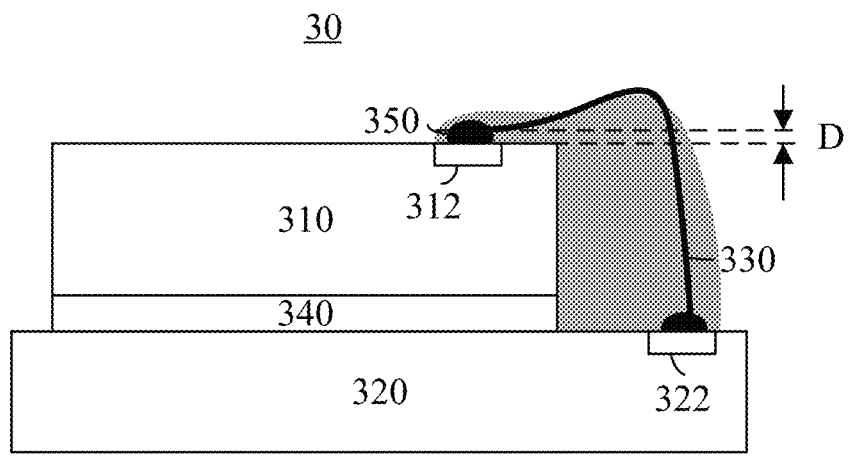
FIG. 9 is a schematic structural diagram of another chip package structure according to an embodiment of the present application.

As shown in FIG. 9, the pin pad 312 and the substrate pad 322 are electrically connected by adopting the SSB method, and the gold balls are formed on both the pin pad 312 and the substrate pad 322; and in particular, the gold ball 350 located on the pin pad 312 may protect the pin pad 312 from being damaged when the pressure is applied to the pin pad 312 and the solder joint is formed by thermal ultrasound, an intensity of the solder joint at the pin pad 312 may be improved, which is conducive to improving reliability.

Specifically, in the process of packaging and soldering, the lead 330 and the gold ball 350 are formed into an integral structure by ultrasonic heat or other soldering methods.

Optionally, as shown in FIG. 9, when the ultra-low wire arc is implemented by adopting the foregoing reverse wire bonding method, a first segment of the lead in the lead 330 is located above the chip 310, and a distance D between the plane where the lowest point of the first segment of lead is located and the surface of the chip is not greater than 10 μm.

Figure 10:
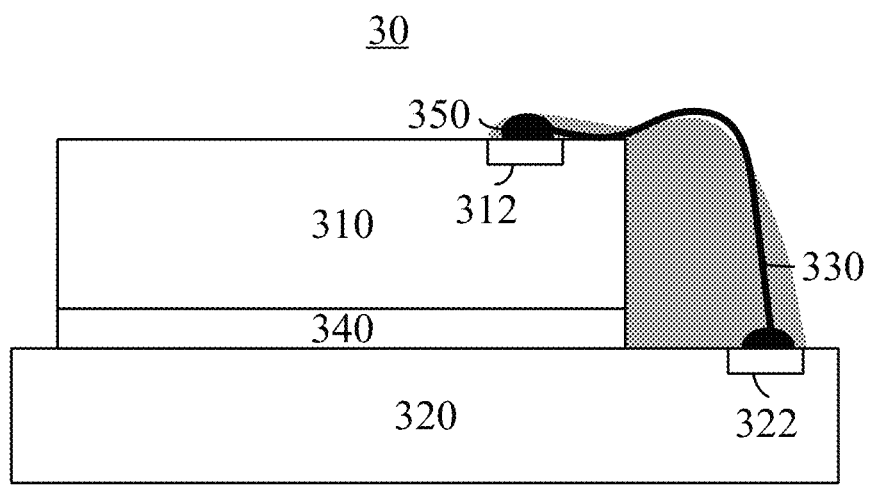
FIG. 10 is a schematic structural diagram of another chip package structure according to an embodiment of the present application.

In particular, as shown in FIG. 10, when the distance D between the lowest point of the first lead and the surface of the chip is 0, the lead 330 may be in contact with the upper surface of the chip 310.

Optionally, the chip 310 further includes a test metal unit 313 disposed in an edge region of the chip that is not under the lead. Hereinafter, the number of the test metal units 313 may be one or more.

Specifically, according to an embodiment of the present application, in a process of fabricating a chip on a wafer, one chip 310 includes a circuit region and a non-circuit region, where the circuit region includes all circuit structures of the chip, the pin pad and other regions with electrical characteristics that need to be actually used. The non-circuit region is a cut-off channel between chips and does not include a device or structure electrically connected to the chip. A plurality of metal test units (test key) 313 are placed between the circuit regions of the chip, that is, placed in the non-circuit region of the chip, and the plurality of metal test units 313 are configured to monitor a graph pattern of a semiconductor process, and may have the same structure as a transistor or other semiconductor devices in a chip circuit, including a stacked structure of the device such as a metal layer, a dielectric layer, a passivation layer, or the like. Generally speaking, in order to facilitate the connection of the chip and other circuits, a metal layer is formed on a surface of the device in the chip circuit, and accordingly, the metal layer is also formed on the surface of the plurality of metal test units.

It should be understood that in the embodiment of the present application, the test metal unit 313 may also be a metal region or a conductive region for other functional purposes, such as a mark or a line of the metal material or other conductive materials, which is not limited in the embodiment of the present application.

Figure 11:
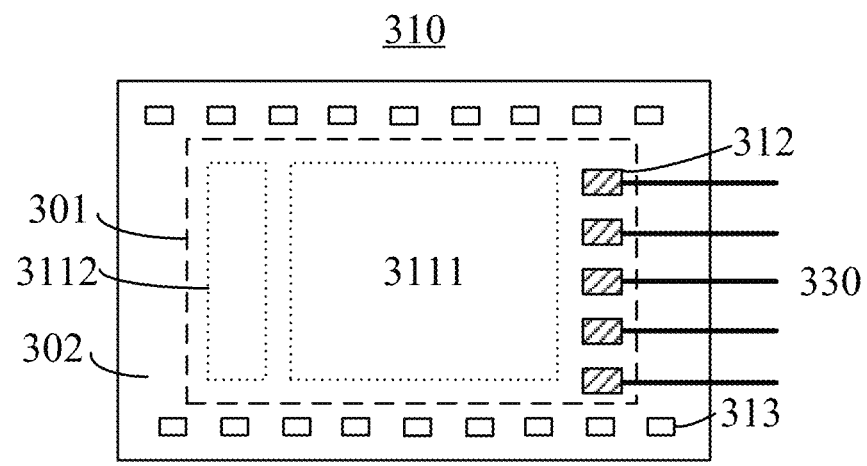
FIG. 11 is a schematic plan view of a chip in a chip package structure according to an embodiment of the present application.

Specifically, as shown in FIG. 11, a plurality of pin pads 312 are located at an edge of the circuit region 301 to facilitate connection with other electronic components through a plurality of leads 330. The plurality of test metal units 313 are located in the non-circuit region 302, that is, a peripheral region of the chip 310, and are located a region that is not under the plurality of leads 330.

Preferably, in one possible implementation manner, the pin pad 312 is located on one side of the chip 310, and the test metal unit 313 is located on other three sides of the chip 310. It should be understood that when the pin pad 312 is located on one side of the chip 310, the test metal unit 313 may be located on any one or more of the other three sides of the chip 310. For example, as shown in FIG. 11, the pin pad 312 is located on a right side of the chip 310, and the test metal unit 313 is located on upper and lower sides of the chip 310. Optionally, the test metal unit 313 may be located on only one side of the upper, lower or left sides of the chip 310, or on any two or three sides of the upper, lower and left sides of the chip 310.

Optionally, the pin pad 312 may also be located on two or three sides of the chip 310, and the test metal unit 313 may be located on other sides of the chip 310.

Figure 12:
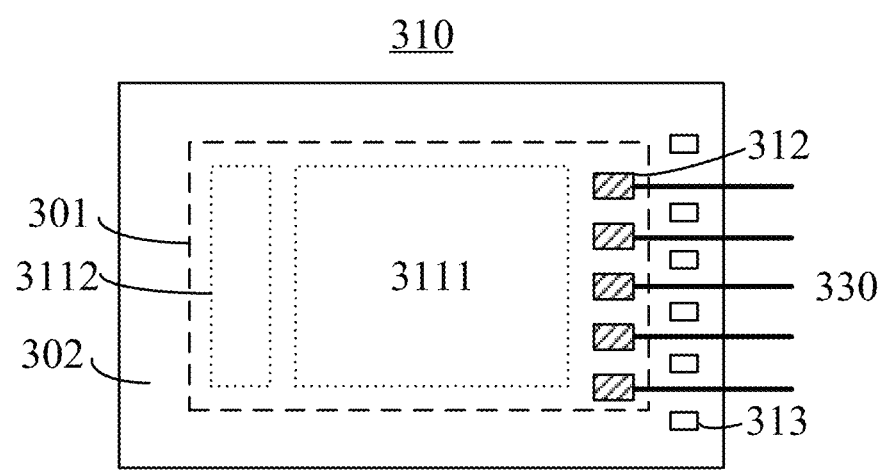
FIG. 12 is a schematic plan view of another chip in a chip package structure according to an embodiment of the present application.

Optionally, in another possible implementation manner, the test metal unit 313 may also be located on the same side as the pin pad 312. For example, as shown in FIG. 12, the pin pad 312 and the test metal unit 313 are both located on the right side of the chip 310, where the lead 330 is connected to the pin pad 312, and the one test metal unit 313 is located in a region under and between the two leads 330, in other words, projection of the lead 330 on the chip 310 is located in a region between the two test metal units 313 instead of in the test metal unit 313.

According to a solution of an embodiment of the present application, the test metal unit 313 is disposed at a position of an edge region of the chip 310 that is not under the lead 330, so that the following is avoided: when the pin pad 312 is electrically connected to the lead, the ultra-low lead 330 is in contact with the test metal unit 313, thereby causing the pin pad 312 and the chip 310 to be damaged due to the short circuit connection between the pin pad 312 and the test metal unit 313.

In the foregoing, as shown in FIGS. 2-10, the chip 310 is disposed above the substrate 320, and the chip 310 is directly adhered to an upper surface of the substrate 320 through a chip attaching adhesive 340; and a thickness of the chip package structure 30 may be reduced by optimizing a height of the lead protection adhesive 360.

Further, the thickness of the chip package structure 30 may be further reduced by improving a positional relationship between the substrate 320 and the chip 310.

Figure 13:
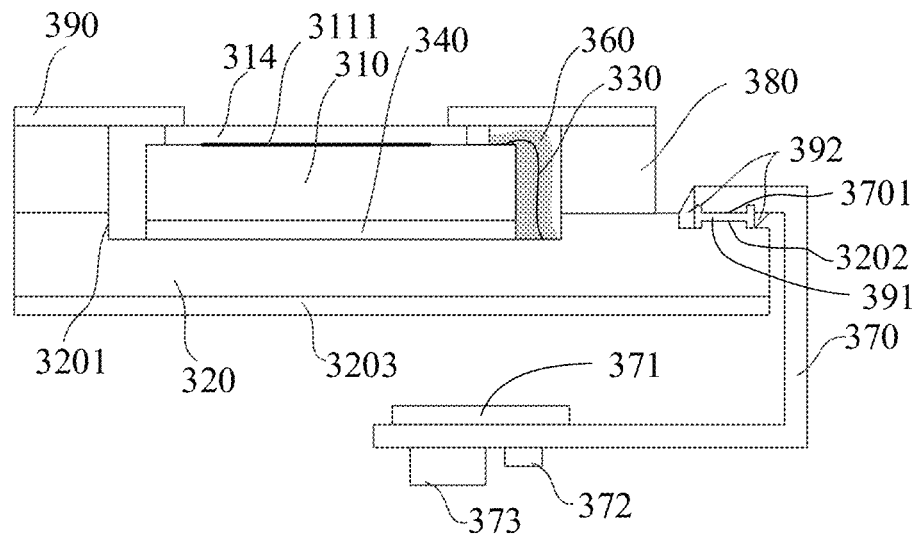
FIG. 13 is a module structure diagram of a chip package structure according to an embodiment of the present application.

Optionally, as illustrated in FIG. 13, an upper surface of the substrate 320 extends downward to form a first groove 3201, and at least a portion of the chip 310 is disposed in the first groove 3201 and electrically connected to the substrate 320. For example, a lower surface of the chip 310 is fixedly connected to a bottom of the first groove 3201 and electrically connected to the substrate 320 through the lead 330.

Optionally, the chip 310 is disposed under a display screen, for example, the display screen 120 in FIG. 1, through the substrate 320. When the chip 310 is an optical fingerprinting sensor chip, the chip 310 is configured to receive a fingerprint detection signal returned by reflection or scattering via a human finger above the display screen 120, and detect fingerprint information of the finger based on the fingerprint detection signal.

At least a portion of the chip 310 is disposed in the first groove 3201, which could effectively reduce the thickness of the package structure 30; and the chip 310 is disposed under the display screen 120 through the substrate 320, which may avoid the use of an attaching adhesive to fixedly connect the chip 310 and the display screen 120, thereby reducing cost and complexity of an electronic device. For example, the substrate 320 is fixed to a middle frame of an electronic device in which the chip package structure 30 is located.

In some embodiments, the number of the chips 310 may be one or more. For example, the chip 310 may include a plurality of optical fingerprint sensor chips, and the plurality of optical fingerprint sensor chips are arranged side by side in the first groove to be spliced into an optical fingerprint sensor chip component. The optical fingerprint sensor chip component may be configured to acquire a plurality of fingerprint images at the same time, and the plurality of fingerprint images may be used as a fingerprint image for fingerprint identification after being spliced. With reference to FIG. 13, the chip 310 may be a sensor chip having a light detection array 3111. The light detection array 3111 may include a plurality of optical sensing units, and each of the optical sensing units may specifically include a photo detector or a photoelectric sensor. In other words, the chip 310 may include a photo detector array (or referred to as a photoelectric detector array, and a photoelectric sensor array) including a plurality of photo detectors distributed in an array.

With reference to FIG. 13, a size of the first groove 3201 is greater than a size of the chip 310 such that there is a gap between a side wall of the chip 310 and a side wall of the first groove 3201 for accommodating the lead 330. In addition, the size of the first groove 3201 is greater than the size of the chip 310, which may also reduce installation complexity and disassembly complexity of the chip 310.

A depth of the first groove 3201 may include a thickness of a cover film of the substrate 320 and a thickness of a conductive layer located under the cover film. The cove film of the substrate 320 may be an insulating layer for protecting and insulating the conductive layer under the cover film. The conductive layer located under the cover film is a circuit layer or a wiring layer of the substrate 320, and the chip 310 may achieve an electrical connection with an external device through the circuit layer or the wiring layer of the substrate.

For example, the substrate 320 may include at least two conductive layers. In this case, the depth of the first groove 3201 includes a first conductive layer located under the cover film of the substrate 320, the chip 310 may be electrically connected to a second conductive layer under an insulating layer through a conductive through hole (for example, a through hole penetrating the insulating layer under the first conductive layer), and the chip 310 may thus be electrically connected to the substrate 320.

With reference to FIG. 13, the chip 310 may be fixed in the first groove 2301 by the chip attaching adhesive 340 for the chip 310.

It should be understood that the chip 310 may also be fixedly connected to the side wall of the first groove 3201, or may be fixed in the first groove 3201 by other means. For example, the chip 310 may be fixed in the first groove 3201 by a buckle or a screw, which is not specifically limited in this embodiment.

With reference to FIG. 13, a lower surface of the substrate 320 may further be provided with a double-sided adhesive 3203, so as to adhere the substrate 320 to a bottom of a groove of a middle frame of an electronic device 30.

It should be understood that the substrate 320 may also be fixedly connected to a side wall of the groove of the middle frame, or the substrate 320 may be fixedly disposed in a groove of a middle frame by other means (such as a buckle or a screw), which is not specifically limited in this embodiment of the present application.

With reference to FIG. 13, the upper surface of the substrate 320 may be provided with a connecting finger 3202 of the substrate 320 formed at a side of the first groove 3201. In other words, the upper surface of the substrate 320 may be provided with a convex structure of the conductive layer of the substrate 320 formed at a side of the first groove 3201, to form the connecting finger 3202 of the substrate 320.

It should be understood that a specific structure of the connecting finger 3202 of the substrate 320 is not limited in the present application. As an example, as illustrated in FIG. 13, the upper surface of the substrate 320 extends downward in a first region to form a second groove, the upper surface of the substrate 320 and an upper surface of the connecting finger of the substrate 320 form a second step in a second region, the first region is a region where the connecting finger of the substrate 320 is located on a side close to the first groove 3201, and the second region is a region where the connecting finger of the substrate 320 is located on a side away from the first groove 3201. Further, a depth of the second groove may include a thickness of a cover layer of the substrate 320 and a thickness of a conductive layer located under the cover layer, and a thickness of the first step is the thickness of the conductive layer of the substrate 320 located under the cover layer such that a portion of the conductive layer of the substrate 320 forms a convex structure with a convex surface facing upward, thereby forming the connecting finger 3202 of the substrate 320.

With reference to FIG. 13, the chip package structure 30 may further include a flexible circuit board 370 and an anisotropic conductive adhesive film 391. The flexible circuit board 370 is provided with a connecting finger 3701 of the flexible circuit board 370; and the connecting finger 3701 of the flexible circuit board 370 is electrically connected to the connecting finger 3202 of the substrate 320 through the anisotropic conductive adhesive film 391.

For example, the connecting finger 3701 of the flexible circuit board 370 may be located at one end of the flexible circuit board 370. That is, one end of the flexible circuit board 370 may be electrically connected to one end of the substrate 320 by laminating the anisotropic conductive adhesive film 391.

The substrate 320 and the flexible circuit board 370 are electrically connected through the connecting finger, which may not only ensure insulativity between contact sheets, but also ensure conductivity between the substrate 320 and the flexible circuit board 370. Particularly, in a case that the chip 310 includes a plurality of chips, the plurality of chips on the substrate 320 may be quickly electrically connected to the flexible circuit board 370 through the connecting finger, and thus installation complexity and disassembly complexity could be reduced.

It should be understood that the specific structure of the connecting finger 3701 of the flexible circuit board 370 is not limited in the present application. As an example, as illustrated in FIG. 13, a lower surface of the flexible circuit board 370 may extend upward in a third region to form a third groove, the lower surface of the flexible circuit board 370 and a lower surface of the connecting finger of the flexible circuit board 370 may form a third step in a second region, the third region is a region where the connecting finger 3701 of the flexible circuit board 370 is located on a side away from the first groove 3201, and the second region is a region where the connecting finger 3701 of the flexible circuit board 370 is located on a side close to the first groove 3201.

With reference to FIG. 13, the chip package structure 30 may further include a protection adhesive 392 for the anisotropic conductive adhesive film 391, the protection adhesive 392 may be provided at both ends of the anisotropic conductive adhesive film 391 to protect the anisotropic conductive adhesive film 391, and further protect the connecting finger 3202 of the substrate 320 and the connecting finger 3701 of the flexible circuit board 370.

With reference to FIG. 13, the chip package structure 30 may further include a support 380 and a first foam layer 390, the first foam layer 390 is disposed above the support 380 and provided with an opening penetrating the first foam layer 390, and the chip 310 may receive a fingerprint detection signal returned by reflection or scattering via the finger through the opening of the first foam layer 390.

Optionally, the first foam layer 390 may be a foam layer of the chip package structure 30, or may be a foam layer of the electronic device located between the display screen 120 and the middle frame, which is not specifically limited in the present application. In other words, when the first foam layer 390 is the foam layer of the chip package structure 30, the first foam layer 390 may be in direct contact with the display screen 120, and further the first foam layer 390 may be in a state of compression; and when the first foam layer 390 is a foam layer of the electronic device located between the display screen 120 and the middle frame, the chip package structure 30 is directly attached to a lower surface of a foam layer under the display screen 120.

It should be understood that the support 380 may be formed of any material that can be used to fixedly connect the substrate 320 and the first foam layer 390. For example, the support 380 may be a support formed of a double-sided adhesive.

With reference to FIG. 13, a side wall of the support 380 that is close to the chip 310 may be aligned with the side wall of the first groove 3201 such that there is a gap between the support 380 and the chip 310 for accommodating the lead 330.

The gap between the support 380 and the chip 310 may be used not only to accommodate the lead 330, but also to accommodate the lead protection adhesive 360, thereby ensuring conductivity of the lead 330 and performance of the chip package structure 30. Moreover, the substrate 320 may also be fixed under the display screen 120 through the flexible circuit board 370 such that the chip 310 is fixed under the display screen 120.

For example, as illustrated in FIG. 13, space for accommodating the lead protection adhesive 360 includes, but is not limited to, a gap formed between the side wall of the chip 310 and the side wall of the first groove 3201, a gap formed between the chip 310 and the support 380, and a gap formed between the chip 310 and the first foam layer 390.

With reference to FIG. 13, the chip package structure 30 may further include a light path layer 314, and the light path layer 314 is configured to transmit the fingerprint detection signal returned by reflection or scattering via the finger to the chip 310. The light path layer 314 is disposed above the chip 310 and may be configured to achieve a light path design. In an embodiment of the present application, the light path design of the light path layer 314 may refer to the foregoing light path design of the optical component 132 of the optical fingerprint apparatus 130, which is not repeatedly described herein, and only a light path design adopting the micro-lens layer is selected as exemplary description. As an optional embodiment, the light path layer 314 includes a micro-lens layer and a light blocking layer, the micro-lens layer may have a micro-lens array formed by a plurality of micro-lenses, the light blocking layer has a plurality of micro-holes and is disposed under the micro-lens layer, the micro-holes are in one-to-one correspondence with the micro-lenses, and pixel units of the light detection array 3111 are in one-to-one correspondence with the micro-lenses. Optionally, the light path layer may further include another optical film layer, and specifically, other optical film layers may also be formed between the micro-lens layer and the chip 310, for example, a dielectric layer or a passivation layer. Optionally, the light path layer 314 may further includes a filter disposed above the micro-lens layer or disposed in a light path between the micro-lens layer and the chip 310. Reference may be made to the foregoing content for details and no further details are provided herein.

In an embodiment of the present application, the filter is used to reduce undesired ambient light in fingerprint sensing to improve optical sensing of received light by the chip 310. The filter may be specifically used to reject light with a specific wavelength, such as near infrared light and part of red light etc. For example, human fingers absorb most of the energy of light with the wavelengths under 580 nm, if one or more optical filters or optical filtering layers are designed to reject light with wavelengths from 580 nm to infrared light, undesired contributions to the optical detection in fingerprint sensing from the ambient light may be greatly reduced.

For example, the filter may include one or more optical filters, the one or more optical filters may be disposed, for example, as bandpass filters to allow transmission of the light emitted by an OLED screen while blocking other light components such as the infrared light in the sunlight. This optical filtering could be effective in reducing background light caused by the sunlight when using the under-screen chip package structure 30 outdoors. The one or more optical filters may be implemented as, for example, optical filter coating layers formed on one or more continuous interfaces or may be implemented as one or more discrete interfaces. It should be understood that the filter may be fabricated on a surface of any optical member of the light path layer 314 or on a light path along reflected light formed by reflection of the finger to the chip 310, which is not specifically limited in this embodiment of the present application.

In addition, a light incident surface of the filter may be provided with an optical inorganic coating or organic blackening coating layer, such that reflectance of the light incident surface of the filter is lower than a first threshold, for example, 1%, thereby ensuring that the chip 310 is capable of receiving sufficient light signals to enhance the effect of fingerprint identification.

For example, the filter is fixed to the upper surface of the chip 310 through a fixing apparatus. The filter and the chip 310 may be fixed by dispensing in a non-photosensitive region of the chip 310, and there is a gap between the filter and a photosensitive region of the chip 310. Alternatively, a lower surface of the filter is fixed on the upper surface of the chip 310 by glue having a refractive index lower than a preset refractive index, for example, the preset refractive index includes but is not limited to 1.3.

It should be noted that when the filter is attached to the upper surface of the chip 310 by filling of an optical adhesive, if a thickness of the adhesive covering the upper surface of the chip 310 is uneven, a Newton ring phenomenon may occur, thereby affecting the effect of fingerprint identification.

Compared with the implementation manner in which the filter is fixed onto the chip 310 by the fixing apparatus, when the filter is a plated film on the chip 310 or another optical film layer, the use of a filter, such as a base material of blue glass or white glass is avoided, which may not only avoid the Newton ring phenomenon and further improve the effect of fingerprint identification, but may also effectively reduce the thickness of the chip package structure 30.

With reference to FIG. 13, the chip package structure 30 may further include an image processor 371, which is electrically connected to the substrate 320. For example, the image processor 371 is disposed on the flexible circuit board 370 and electrically connected to the substrate 320 through the flexible circuit board 370. For example, the image processor 371 may be a micro processing unit (Micro Processing Unit, MCU) for receiving a fingerprint detection signal (for example, a fingerprint image) transmitted from the chip 310 through the flexible circuit board 370, and simply processing the fingerprint detection signal.

With reference to FIG. 13, the chip package structure 30 may further include at least one capacitor 372, which is electrically connected to the substrate 320 and configured to optimize the fingerprint detection signal captured by the chip 310. For example, the at least one capacitor 372 is disposed on the flexible circuit board 370 and electrically connected to the substrate 320 through the flexible circuit board 370, thereby being electrically connected to the chip 310, and the at least one capacitor 372 may be configured to optimize the fingerprint detection signal captured by the chip 310. For example, the at least one capacitor 372 is configured to filter the fingerprint detection signal captured by the chip 310, where the chip 310 may correspond to one or more capacitors. For example, each chip in the chip 310 corresponds to one or more capacitors.

With reference to FIG. 13, the chip package structure 30 may further include a connector 373, which is electrically connected to the substrate 320. For example, the connector 373 may be electrically connected to the substrate 320 through the flexible circuit board 370. The connector 373 may be configured to connect with an external apparatus or other members of the electronic device so as to enable communication with the external apparatus or other members of the electronic device. For example, the connector 373 may be configured to connect a processor of the electronic device such that the processor of the electronic device receives a fingerprint detection signal processed by the image processor 373 and performs fingerprint identification based on the processed fingerprint detection signal.

It should be understood that FIG. 13 is only an example of the present application and may not be understood as limiting the present application.

For example, in some alternative embodiments, the chip 310 may be provided with a through silicon via (Through Silicon Via, TSV) and/or a redistribution layer (Redistribution Layer, RDL), and the TSV and/or RDL is used to guide a pin of the chip 310 from an upper surface to a lower surface. The lower surface of the chip 310 may be provided with a wiring layer through the TSV and/or RDL. The wiring layer may be electrically connected to a wiring layer in the first groove 3201 of the substrate 320 through the lead 330. In this case, an outer wall of the chip 310 may be attached to the side wall of the first groove 3201, and a gap for accommodating the lead 330 may be disposed between the lower surface of the chip 310 and the bottom of the first groove 3201. Further, the chip 310 may be further provided with a protective layer on a surface of the wiring layer for protecting and insulating the chip 310.

Optionally, the support 380 may be a support formed of a material having adhesive properties. For example, the support 380 may be a support formed of a double-sided adhesive, but the embodiment of the present application is not limited thereto. For example, the support 380 may also be a support formed of a material having no adhesive properties. For example, the material of the support 380 includes, but is not limited to, metal, resin, a fiberglass composite plate or the like; and in this case, the support 380 needs to be fixed between the first foam layer 390 and the substrate 320.

It should be understood that, when the support 380 is a support structure having no adhesive properties, in addition to the support 380, the chip package structure 30 may include a double-sided adhesive and a support attaching adhesive, where a lower surface of the support 380 is connected onto the upper side of the substrate 320 by the support attaching adhesive, and an upper surface of the support 380 is connected to the first foam layer 390 by the double-sided adhesive. As an optional embodiment, the support 380 and the support attaching adhesive may also be an integral structure, and the integral structure serves as a support. For example, the support may be a support formed of a single-sided adhesive for connecting the substrate 320, and an upper surface of the support is connected to the first foam layer 390 by the double-sided adhesive.

Figure 14:
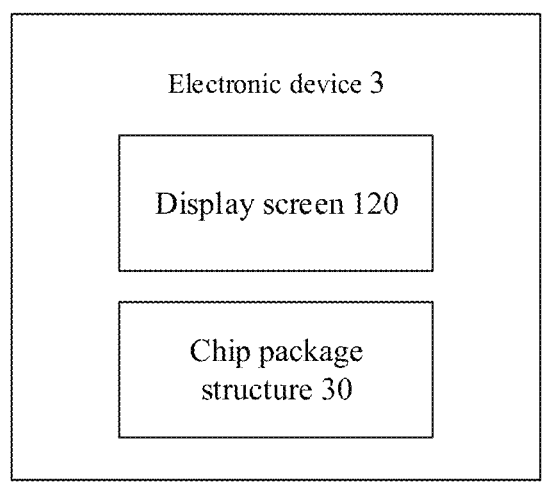
FIG. 14 is a schematic block diagram of an electronic device according to an embodiment of the present application.

As illustrated in FIG. 14, the present application further provides an electronic device 3 including a chip package structure 30 according to any one of the embodiments as mentioned above.

Optionally, the electronic device may further include a display screen 120, and the chip package structure 30 is disposed under the display screen 120.

It should be appreciated that specific examples in embodiments of the present application are just for helping those skilled in the art better understand the embodiments of the present application, rather than for limiting the scope of the present application.

It should be appreciated that terms used in embodiments of the present application and the claims appended hereto are merely for the purpose of describing particular embodiments, and are not intended to limit the embodiments of the present application. For example, the use of a singular form of "a", "the above" and "the" in the embodiments of the present application and the claims appended hereto are also intended to include a plural form, unless otherwise clearly indicated herein by context.

Those of ordinary skill in the art may be aware that, units of the examples described in the embodiments disclosed in this paper may be implemented by electronic hardware, computer software, or a combination of the two. To clearly illustrate interchangeability between the hardware and the software, the foregoing illustration has generally described composition and steps of the examples according to functions. Whether these functions are performed by hardware or software depends on particular applications and designed constraint conditions of the technical solutions. Persons skilled in the art may use different methods to implement the described functions for each particular application, but it should not be considered that the implementation goes beyond the scope of the present application.

In the several embodiments provided in the present application, it should be understood that, the disclosed system and apparatus may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual coupling or direct coupling or communication connection may be indirect coupling or communication connection through some interfaces, apparatuses or units, and may also be electrical, mechanical, or connection in other forms.

The units described as separate parts may or may not be physically separate, and parts displayed as units may or may not be physical units, may be located in one position, or may be distributed on multiple network units. Part of or all of the units here may be selected according to a practical need to achieve the objectives of the solutions of an embodiments of the present application.

In addition, the respective functional units in an embodiments of the present application may be integrated in a processing unit, or the respective units exist separately and physically, or two or more units are integrated in one unit. The integrated unit may be implemented in a form of hardware, or may be implemented in a form of a software functional unit.

If the integrated unit is implemented in the form of the software functional unit and is sold or used as an independent product, it may be stored in a computer readable storage medium. Based on such understanding, the nature of the technical solutions of the present application, or the part contributing to the prior art, or all of or part of the technical solutions may be implemented in a form of software product. The computer software product is stored in a storage medium and includes several instructions for instructing a computer device (which may be a personal computer, a server, or a network device, and the like) to execute all of or part of the steps of the method described in an embodiments of the present application. The preceding storage mediums includes various mediums that may store program codes, such as, a U disk, a removable hard disk, a read-only memory (Read-Only Memory, ROM), a random access memory (Random Access Memory, RAM), a magnetic disk, an optical disk, or the like.

The foregoing descriptions are merely specific implementations of the present disclosure. The protection scope of the present application, however, is not limited thereto. Various equivalent modifications or replacements may be readily conceivable to any person skilled in the art within the technical scope disclosed in the present application, and such modifications or replacements shall fall within the protection scope of the present application. Thus, the protection scope of the present application shall be subject to the protection scope of the claims.

What is claimed is:

1. A chip package structure, comprising: a chip, a substrate, a lead and a lead protection adhesive;
   wherein the lead is configured to electrically connect the chip and the substrate;
   the lead protection adhesive is configured to support the lead; and
   a highest point of the lead protection adhesive is not higher than a highest point of an upper edge of the lead in the direction perpendicular to the substrate;
   the highest point of the lead protection adhesive is not lower than a highest point of a lower edge of the lead and the lead protection adhesive completely covers a lower edge of the lead;
   the chip comprises a pin pad and the substrate comprises a substrate pad, the lead is configured to electrically connect the pin pad and the substrate pad; and
   the lead protection adhesive completely covers a first solder joint formed on the substrate pad by the lead and completely covers a second solder joint formed on the pin pad by the lead, and is configured to protect the first solder joint and the second solder joint;
   the chip is an optical fingerprint sensor chip, and is configured to receive a fingerprint detection optical signal returned by reflection or scattering of a human finger and detect fingerprint information of the finger based on the fingerprint detection optical signal, and
   the chip package structure further comprises: a support and a first foam layer, the support is formed of a double-sided adhesive that is used to fixedly connect the substrate and the first foam layer, the first foam layer is disposed above the support and provided with an opening penetrating the first foam layer, and the chip is configured to receive the fingerprint detection optical signal returned by reflection or scattering via the finger through the opening of the first foam layer;
   wherein an upper surface of the substrate extends downward to form a first groove, at least a portion of the chip is disposed in the first groove, and the chip is attached to the groove by chip attaching adhesive;
   a side wall of the support that is close to the chip is aligned with a side wall of a first groove such that there is a gap between the support and the chip along the direction parallel to the upper surface of the substrate, the gap is used for accommodating the lead and the lead protection adhesive.

2. The chip package structure according to claim 1, wherein the lead is connected to the pin pad through a metal ball.

3. The chip package structure according to claim 2, wherein the lead and the metal ball are of an integral structure.

4. The chip package structure according to claim 2, wherein a first segment of the lead in the lead is located above the chip, and a distance between a lowest point of the first segment of the lead and an upper surface of the chip is not greater than 10 μm.

5. The chip package structure according to claim 1, wherein the chip further comprises: a test metal unit; and
the test metal unit is disposed in an edge region of the chip that is not under the lead.

6. The chip package structure according to claim 5, wherein the pin pad is located on one side of the chip, and the test metal unit is located on at least one side of other three sides of the chip.

7. The chip package structure according to claim 1, wherein the lead is a lead fabricated from the substrate pad to the pin pad by employing a reverse wire bonding process.

8. The chip package structure according to claim 1, wherein a distance between the highest point of the lead and an upper surface of the chip is not greater than 35 μm.

9. The chip package structure according claim 8, wherein the chip package structure further comprises a chip attaching adhesive, which connects the chip and the substrate;
a thickness of the chip is between 50 μm and 600 μm, a thickness of the substrate is between 100 μm and 350 μm, and a thickness of the chip attaching adhesive is between 10 μm and 35 μm.

10. The chip package structure according to claim 1, wherein the lead is a gold wire, silver wire or copper wire; and/or
the lead has a wire diameter of 15.2 μm to 25.4 μm.

11. The chip package structure according to claim 1, wherein an upper surface of the substrate extends downward to form a first groove, and at least a portion of the chip is disposed in the first groove.

12. The chip package structure according to claim 11, wherein a size of the first groove is greater than a size of the chip such that there is a gap for accommodating the lead between a side wall of the chip and a side wall of the first groove.

13. The chip package structure according to claim 11, wherein a depth of the first groove comprises a thickness of a cover film of the substrate and a thickness of a conductive layer located under the cover film.

14. The chip package structure according to claim 1, further comprising a light path layer configured to transmit the fingerprint detection optical signal to the optical fingerprint sensor chip, wherein the light path layer is disposed above the optical fingerprint sensor chip and is configured to achieve a light path design.

15. The chip package structure according to claim 14, wherein the first foam layer overlaps the edge of the upper surface of the optical layer.

16. The chip package structure according to claim 1, further comprising a flexible circuit board and an anisotropic conductive adhesive film, wherein the flexible circuit board is provided with a connecting finger of the flexible circuit board, and the connecting finger of the flexible circuit board is electrically connected to a connecting finger of the substrate through the anisotropic conductive adhesive film.

17. The chip package structure according to claim 16, further comprising at least one capacitor, wherein the at least one capacitor is disposed on the flexible circuit board and electrically connected to the substrate through the flexible circuit board, thereby being electrically connected to the chip and the at least one capacitor is configured to optimize the fingerprint detection signal captured by the chip.

18. The chip package structure according to claim 1, wherein the first foam layer is covered and arranged above the lead protection adhesive.

19. A method for preparing a chip package structure, comprising:
electrically connecting a pin pad of a chip and a substrate pad of a substrate by a lead;
covering a first solder joint formed on the substrate pad by the lead, by a protection adhesive covers, wherein a tension of the lead protection adhesive causes the lead protection adhesive to climb up along the lead until the lead protection adhesive covers a second solder joint formed on the pin pad by the lead;
wherein the chip package structure is the chip package structure of claim 1.

20. An electronic device, comprising:
a chip package structure, comprising: a chip, a substrate, a lead, and a lead protection adhesive;
wherein the lead is configured to electrically connect the chip and the substrate;
the lead protection adhesive is configured to support the lead; and
a highest point of the lead protection adhesive is not higher than a highest point of an upper edge of the lead in the direction perpendicular to the substrate;
the highest point of the lead protection adhesive is not lower than a highest point of a lower edge of the lead and the lead protection adhesive completely covers a lower edge of the lead;
the chip comprises a pin pad and the substrate comprises a substrate pad, the lead is configured to electrically connect the pin pad and the substrate pad; and
the lead protection adhesive completely covers a first solder joint formed on the substrate pad by the lead and completely covers a second solder joint formed on the pin pad by the lead, and is configured to protect the first solder joint and the second solder joint;
the chip is an optical fingerprint sensor chip, and is configured to receive a fingerprint detection optical signal returned by reflection or scattering of a human finger and detect fingerprint information of the finger based on the fingerprint detection optical signal, and
the chip package structure further comprises: a support and a first foam layer, the support is formed of a double-sided adhesive that is used to fixedly connect the substrate and the first foam layer, the first foam layer is disposed above the support and provided with an opening penetrating the first foam layer, and the chip is configured to receive the fingerprint detection optical signal returned by reflection or scattering via the finger through the opening of the first foam layer;
wherein an upper surface of the substrate extends downward to form a first groove, at least a portion of the chip is disposed in the first groove, and the chip is attached to the groove by chip attaching adhesive;
a side wall of the support that is close to the chip is aligned with a side wall of a first groove such that there is a gap between the support and the chip along the direction parallel to the upper surface of the substrate, the gap is used for accommodating the lead and the lead protection adhesive.

\* \* \* \* \*